United States Patent
King

(10) Patent No.: US 6,690,793 B1
(45) Date of Patent: Feb. 10, 2004

(54) CLICK FREE MUTE SWITCH CIRCUIT FOR TELEPHONES

(75) Inventor: Lawrence King, Nepean (CA)

(73) Assignee: Mitel Corporation, Kanata (CA)

( * ) Notice: Subject to any disclaimer, the term of this patent is extended or adjusted under 35 U.S.C. 154(b) by 0 days.

(21) Appl. No.: 09/571,808

(22) Filed: May 16, 2000

(30) Foreign Application Priority Data

May 17, 1999 (GB) ............................................. 9911433

(51) Int. Cl.[7] .............................................. H04M 1/00
(52) U.S. Cl. ...................................... 379/421; 379/422
(58) Field of Search ................................ 379/421, 419, 379/420.03, 387.01, 388.02, 424, 422, 390.01, 388.07, 388.05

(56) References Cited

U.S. PATENT DOCUMENTS

| | | | |
|---|---|---|---|
| 5,353,347 A | * 10/1994 | Irissou et al. | 379/395 |
| 5,832,075 A | 11/1998 | Gancarcik | |
| 5,881,373 A | * 3/1999 | Elofsson et al. | 455/115 |
| 6,292,560 B1 | * 9/2001 | Gligoric | 379/421 |

FOREIGN PATENT DOCUMENTS

| | | | |
|---|---|---|---|
| EP | 0 921 649 A1 | | 9/1999 |
| GB | 2344711 A | * | 6/2000 |
| GB | 2350256 A | * | 11/2000 |
| JP | 10304487 | | 11/1998 |

* cited by examiner

Primary Examiner—Rexford Barnie
(74) Attorney, Agent, or Firm—Fay, Scharpe, Fagan, Minnich & McKee, LLP

(57) ABSTRACT

A circuit for eliminating switching noise from a mute switch connected between a microphone capable of receiving and transmitting audio signals to a communication system, comprising, a switch state detector connected to the mute switch for generating an on signal in the event that the mute switch is open and generating an off signal in the event that the mute switch is closed, a codec circuit connected to the mute switch in parallel with the switch state detector for delaying the audio signals received by the microphone, and a CPU connected to the codec circuit for receiving the on signal and in response muting the audio signals and for receiving the off signal and in response transmitting the audio signals to the communication system.

4 Claims, 1 Drawing Sheet

CLICK FREE MUTE SWITCH CIRCUIT FOR TELEPHONES

CROSS REFERENCE TO RELATED APPLICATIONS

This application claims the benefit of U.K. Application No. 9911433.2, filed May 17, 1999.

FIELD OF THE INVENTION

This invention relates in general to telephones, and more particularly to a circuit for eliminating click noise when activating a mute switch button.

BACKGROUND OF THE INVENTION

Telephone microphones, particularly those in handsets and headsets, are often provided with a switch to "mute" the outgoing audio so that the user can talk with a local party without conveying information through the phone. The least expensive way to implement this mute function is to use the switch to disconnect the microphone from the telephone set, or to short circuit the microphone. When the switch is activated (or de-activated) a "click" noise may be heard at the remote communication endpoint (and at the local endpoint) as a result of transients generated upon opening and closing of the switch.

Previously, the click noise has been eliminated by adding circuitry connected to the microphone and switch circuit which gently decreases (or increases) the signal from the microphone until the microphone is fully muted (or open). This additional circuitry adds cost (the circuitry which is in addition to the switch) and complexity to the product.

SUMMARY OF THE INVENTION

According to the present invention, a low cost click free muting circuit is provided which takes advantage of the delay in processing signals through a telephone codec circuit. The signal from the microphone passes through the mute switch (when closed) to an amplifier and from there to the codec for conversion to digital PCM. The digital PCM signal from the codec is then transmitted via a CPU to the system (e.g. PBX). According to the invention, a switch detect circuit is provided in parallel with the amplifier for detecting opening of the switch, in response to which a signal is sent to the CPU causing it to generate silence code while the switch is closed.

BRIEF DESCRIPTION OF THE DRAWINGS

A detailed description of the preferred embodiment of the present invention is provided herein below, with reference to the sole drawing of a click free telephone mute circuit in accordance with the principles of the present invention.

DETAILED DESCRIPTION OF THE PREFERRED EMBODIMENT

Figure 1:
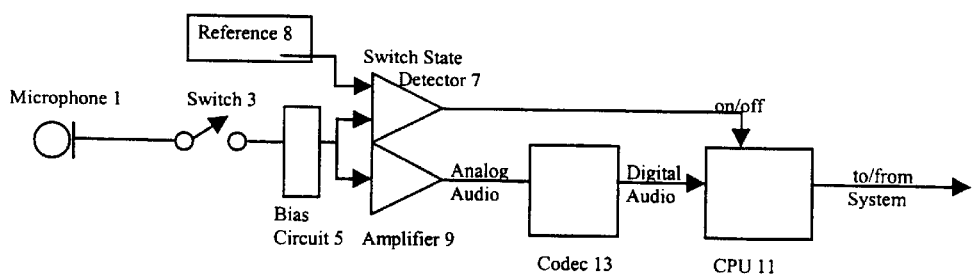

FIG. 1 shows the basic circuitry required to implement the microphone mute circuit of the present invention. The microphone 1 detects audio in its vicinity and generates an AC analog representation thereof which gets passed to the system (e.g. PBX) provided that the mute switch 3 is closed. When the switch is opened then the signal from the microphone is muted.

The bias circuit 5 is used to power the microphone. The signal from the bias circuit is then routed to both the switch state detector 7 and the amplifier 9. The switch state detector compares the DC signal level from the bias circuit 5 with a reference level at input 8. When the DC output of the bias circuit 5 is greater than the reference level the switch state detector 7 indicates to the CPU 11 that the switch 3 is open. When the DC output of the of the bias circuit 5 is less than the reference level the switch state detector 7 indicates to the CPU 11 that the switch is closed. The details of operation of the switch state detector 7 are as set forth in commonly-owned U.S. Pat. No. 5,832,075, the contents of which are incorporated herein by reference.

The amplifier 9 amplifies the AC (audio) signal from the microphone 1. The amplifier is active at all times, even when the switch 3 is open, hence when the switch opens or closes the amplifier 9 amplifies the switch noise which produces the unwanted click noise. Amplifier 9 can amplify both the AC and/or DC components of the signal, although according to the preferred embodiment the amplifier is AC coupled.

The codec 13 converts the analog audio signal to a digital audio signal. The time required for the conversion is very long with respect to the time required for the switch state detector 7 to detect a change in the state of the switch 3 (e.g. the switch state detector takes about 10 microSeconds, and the conversion delay is about 250 microSeconds).

The CPU 11 conditionally transfers the digital audio information to the system. If the switch state detector 7 indicates that the switch 3 is open (microphone 1 disabled) then the CPU 11 is programmed to generate a silence code (i.e. a string of zeroes) to the system. If the switch 3 is closed (i.e. microphone 1 is enabled) then the CPU 11 transfers the digital audio information to the system. For a short period of time (e.g. approximately 100 milliSeconds, although only about 10 milliSeconds are required) after a transition in the switch state from open to closed the CPU 11 continues to transfer a silence code to the system, this action effectively "mutes" the unwanted click noise produced when the switch 3 closes. Immediately after a switch transition from closed to open the CPU 11 starts sending the silence code to the system, thereby muting the unwanted click noise when the switch 3 opens.

It will be appreciated that, although a particular embodiment of the invention has been described and illustrated in detail, various changes and modifications may be made. Any topology where the audio path passes through a long delay (relative to the delay for the switch state detector 7) can use the output of the switch state detector to mute the audio. Thus, the codec 13 may be replaced by any device which contributes delay, and the CPU 11 may be replaced by any device which is capable of generating silence code. Also, the present invention is not limited in its application to hands free telephones. Any application where there is a microphone with a switch to enable/disable the microphone may advantageously use this invention, such as two way radios, PA systems, cellular phones, PBX telephones, Ethernet (IP) telephones, cordless telephones, radio station microphones, corded and cordless microphones, etc. All such changes and modifications may be made without departing from the sphere and scope of the invention as defined by the claims appended hereto.

What is claimed is:

1. A circuit for eliminating switching noise from a mute switch connected between a microphone capable of receiving and transmitting audio signals to a communication system, comprising:

a switch state detector connected to said mute switch for generating an on signal in the event that said mute switch is open and generating an off signal in the event that said mute switch is closed;

a delay circuit connected to said mute switch in parallel with said switch state detector for delaying said audio signals received by said microphone; and a further circuit connected to said delay circuit for receiving said on signal and in response muting said audio signals and for receiving said off signal and in response transmitting said audio signals to said communication system.

2. The circuit of claim 1, wherein said further circuit is a digital circuit for transmitting silence code to said communication system in response to receiving said on signal.

3. The circuit of claim 2, wherein said digital circuit is a CPU.

4. The circuit of claim 1, wherein said delay circuit further comprises a codec for converting said audio signal from analog to digital format prior to transmission to said communication system.

* * * * *